United States Patent
Kim et al.

(12) 
(10) Patent No.: US 6,707,724 B2
(45) Date of Patent: Mar. 16, 2004

(54) APPARATUS FOR PROVIDING REFERENCE VOLTAGES TO MEMORY MODULES IN A MEMORY SYSTEM

(75) Inventors: Do-Geun Kim, Seoul (KR); Myung-Ho Kim, Seoul (KR); Sung-Lae Cho, Seoul (KR); Hee-Dong Kim, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 55 days.

(21) Appl. No.: 10/072,727

(22) Filed: Feb. 6, 2002

(65) Prior Publication Data

US 2002/0105837 A1 Aug. 8, 2002

(30) Foreign Application Priority Data

Feb. 8, 2001 (KR) .......................................... 2001-6188

(51) Int. Cl.$^7$ .......................................... G11C 11/4074
(52) U.S. Cl. .................. 365/189.09; 365/226
(58) Field of Search ............................. 365/189.09, 51, 365/63, 226

(56) References Cited

U.S. PATENT DOCUMENTS

| | | | | |
|---|---|---|---|---|
| 5,563,838 A | * | 10/1996 | Mart et al. | ................... 365/226 |
| 5,831,890 A | * | 11/1998 | Selna et al. | ................... 365/51 |
| 6,363,450 B1 | * | 3/2002 | Lash et al. | ................... 710/301 |
| 2002/0024881 A1 | * | 2/2002 | Nishioka | ..................... 365/233 |

\* cited by examiner

Primary Examiner—Michael S. Lebentritt
Assistant Examiner—J. H. Hur
(74) Attorney, Agent, or Firm—F.Chau & Associates, LLC (57) ABSTRACT

A memory system having a plurality of semiconductor memory devices includes a plurality of memory slots, a plurality of memory modules each having memory devices and being mounted on corresponding one of the memory slots, and a plurality of reference voltage sources for providing reference voltages each having a different level to the respective memory modules.

13 Claims, 11 Drawing Sheets

APPARATUS FOR PROVIDING REFERENCE VOLTAGES TO MEMORY MODULES IN A MEMORY SYSTEM

CROSS REFERENCE

This application claims the benefit of Korean Patent Application No. 2001-6188, filed on Feb. 8, 2001, under 35 U.S.C. §119, the entirety of which is hereby incorporated by reference.

BACKGROUND OF THE INVENTION

1. Field of the Invention

The present invention relates to a memory system having memory devices for storing data, and more particularly, to an apparatus for providing reference voltages to memory modules on which semiconductor memory devices are mounted.

2. Description of Related Art

Figure 1:
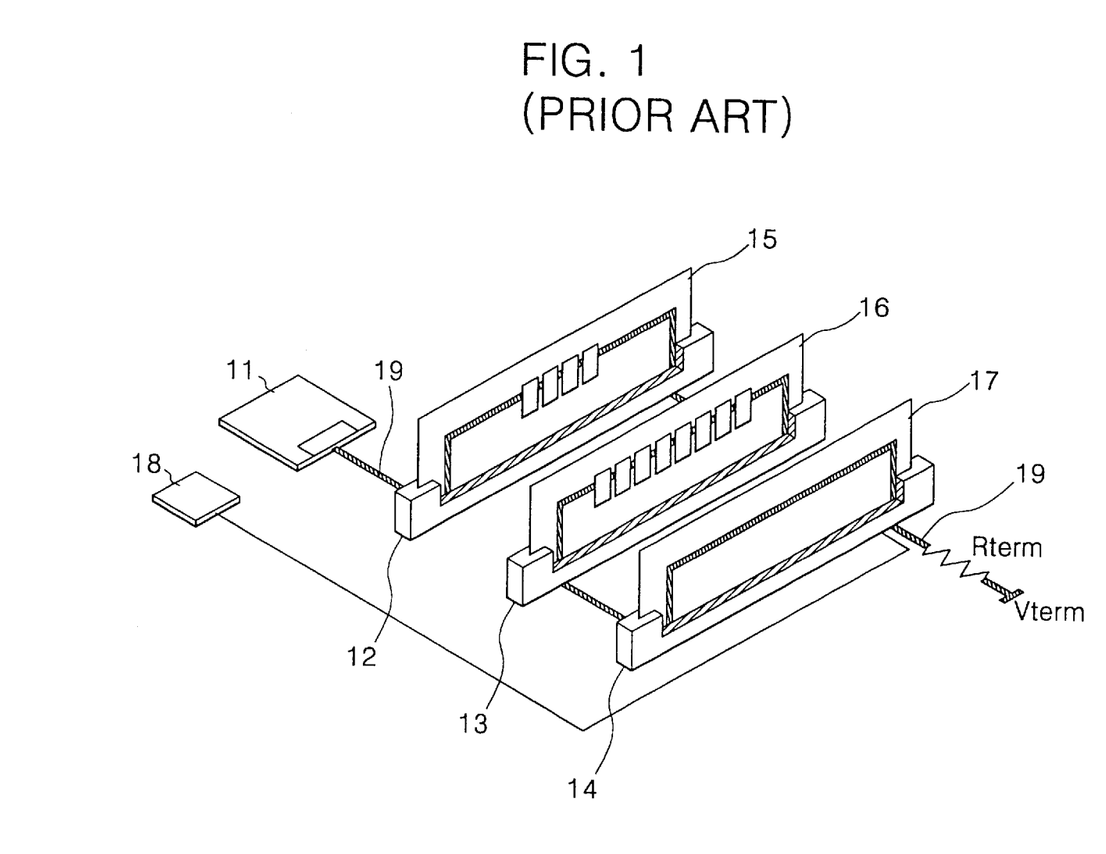
FIG. 1 is a schematic view illustrating a typical Rambus memory system.

FIG. 1 is a schematic view illustrating a configuration of a typical Rambus memory system. The Rambus memory system includes a master element 11 having a Rambus ASIC cell (RAC) and a Rambus memory controller (see 21 FIG. 2A), Rambus in-line module (RIMM) connectors 12 to 14, first and second RIMM memory modules 15 and 16 mounted on the RIMM connectors 12 and 13, a RIMM continuity module 17, and a direct Rambus clock generator (DRCG) 18. The RIMM memory modules 15 and 16 each include a plurality of Rambus DRAMs (RDRAMs), e.g., 256 MB direct RDRAMs.

A Rambus channel 19 provides an interface between the master element 11 and the RDRAMs of each of the first and second RIMM memory modules 15 and 16. The Rambus channel 19 is a transmission line connected between the master element 11 and a terminal resistor Rterm to which a terminal voltage Vterm is applied. The Rambus channel 19 can support a predetermined number of RDRAMs, e.g., 32 RDRAMs, without additional drivers.

In the Rambus memory system of FIG. 1, reference voltages applied to the respective RIMM memory modules 15 and 16 mounted on the respective RIMM connectors 12 and 13 are all equal to each other in level. That is, the reference voltages with the same level are applied to the RDRAMs of the RIMM memory module 15 and the RDRAMs of the RIMM memory module 16.

Figure 2A:
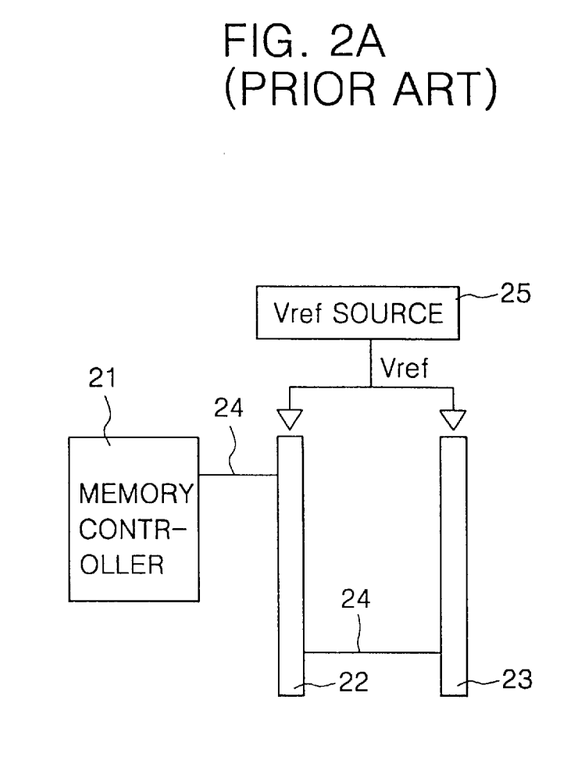
FIGS. 2A and 2B are block diagrams illustrating memory modules and a reference voltage source of the Rambus memory system in FIG. 1.
Figure 2B:
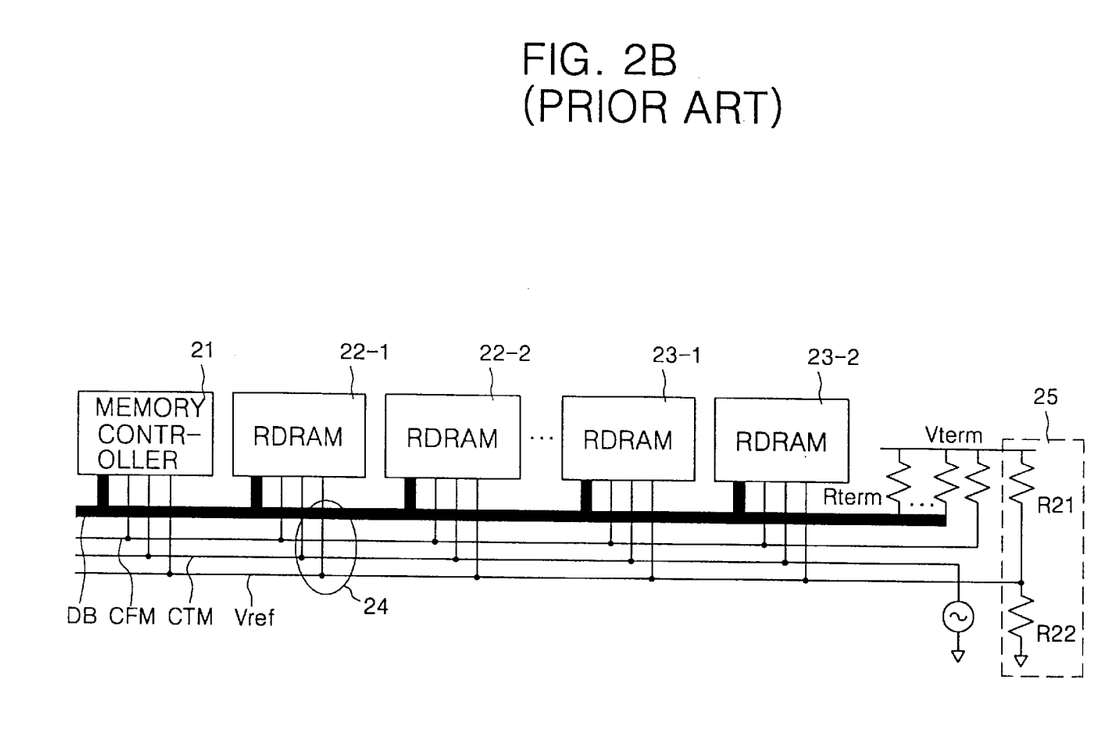

FIGS. 2A and 2B are block diagrams illustrating a conventional system of providing a reference voltage Vref to RIMM memory modules in a Rambus memory system. As shown in FIGS. 2A and 2B, a memory controller 21 is connected to each of the first and second RIMM memory modules 22 and 23 mounted on the RIMM connectors 12 and 13 (referring to FIG. 1), respectively, through a Rambus channel 24. The reference voltage Vref is applied from a reference voltage source 25 to each of the RIMM memory modules 22 and 23, including RDRAMs 22-1 and 22-2 of the first RIMM memory module 22 and RDRAMs 23-1 and 23-2 of the second RIMM memory module 23.

The reference voltage source 25 includes serial resistors R21 and R22 that are serially connected between the terminal voltage Vterm and ground. The reference voltage source 25 supplies the reference voltage Vref that is voltage-divided by the serial resistors R21 and R22, to the RDRAMs 22-1 and 22-2 of the RIMM memory module 22 and to the RDRAMs 23-1 and 23-2 of the RIMM memory module 23. As a result, the same level reference voltage is applied to the respective RDRAMs 22-1, 22-2, 23-1 and 23-2.

Each of the RDRAMs 22-1 to 23-2 includes a DRAM core region, a Rambus interface, and an analog region for a delay lock loop (DLL) and a power supply. The DRAM core region is almost the same as a typical DRAM core. The Rambus interface is to provide an interface between the DRAM core region and an external portion of a memory chip, and an open drain type driver is widely used as the Rambus interface.

Figure 3:
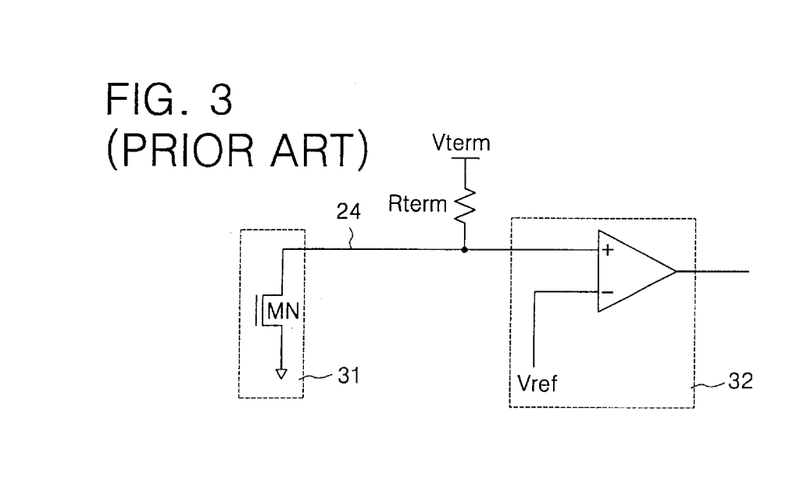
FIG. 3 is a circuit diagram illustrating a Rambus interface of the Rambus memory system in FIG. 1.

FIG. 3 is a circuit diagram illustrating an example of the open drain type Rambus interface. When an NMOS transistor MN of a driver 31 is turned on, the Rambus interface of FIG. 3 outputs data having a logic "low" level. When the NMOS transistor MN is turned off, the Rambus interface of FIG. 3 outputs data having a logic "high" level which is obtained from the terminal voltage Vterm connected to the terminal resistor Rterm. In FIG. 3, the reference numeral "32" denotes an output terminal.

Figure 4:
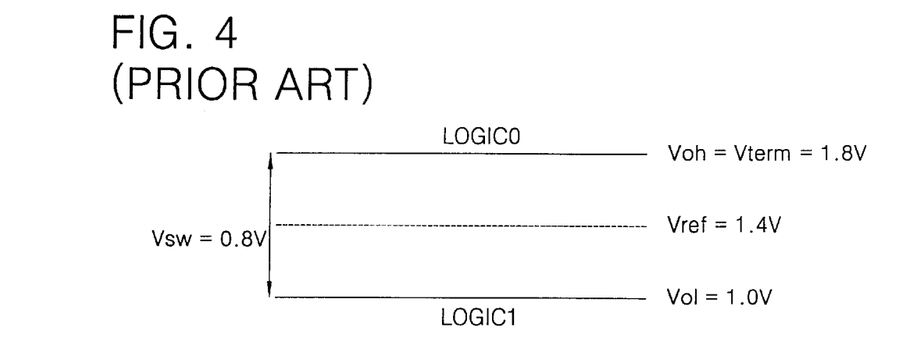
FIG. 4 shows a RSL output level of a RDRAM of the Rambus memory system in FIG. 1.

FIG. 4 shows an example of a Rambus signaling level (RSL) output level of the conventional RDRAM. When the RDRAM normally outputs data of the RSL output level through the Rambus interface of FIG. 3, the level of a high voltage Voh (i.e., the terminal voltage Vterm) that is set to logic "0" is about 1.8 volts, the level of the reference voltage Vref is about 1.4 volts, and the level of a low voltage Vol that is set to logic "1" is 1.0 volt. Therefore, the normal RSL output level has Voh−Vref=Vol−Vref, and has a voltage swing Vsw of about 0.8 volts. The RDRAM can have the RSL output level having an amplitude less than 1.0 volt by terminating one end of the Rambus channel and connecting the terminated end to the terminal voltage Vterm having a level of about 1.8 volts that is lower than a power voltage for a driving current to pass through the terminal resistor Rterm.

However, in the conventional Rambus memory system, when data is read from one of the RDRAMs of one RIMM memory module and data are continuously, without any gap, read from one of the RDRAMs of another RIMM memory module, a so called "back-to-back noise" may be generated from the data read from a RDRAM of one RIMM memory module, affecting data read from a RDRAM of another RIMM memory module.

Figure 5:
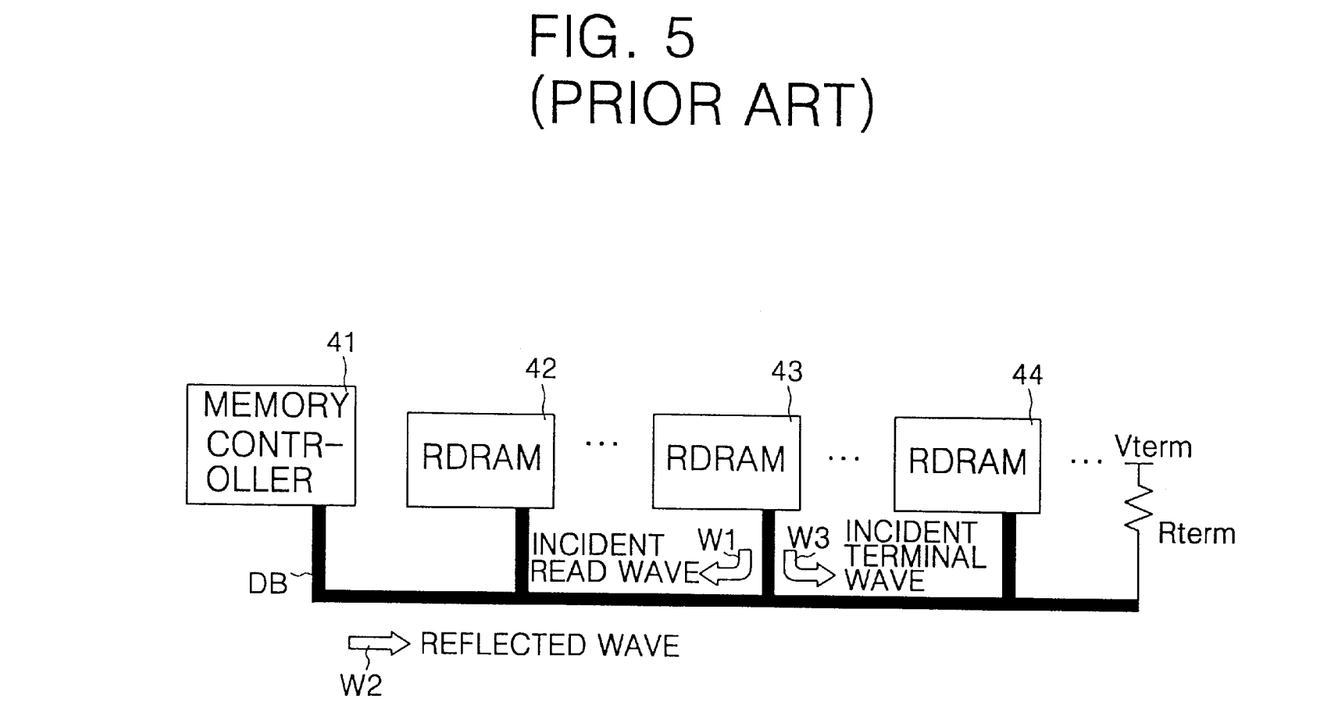
FIG. 5 is a block diagram illustrating a memory module of the Rambus memory system having three kinds of waves generated during a data read operation.

FIG. 5 is a schematic block diagram illustrating a conventional Rambus memory system having three kinds of waves generated due to inherent characteristics of the Rambus channel whose one end is terminated. When data is read from one of the RDRAMs of a RIMM memory module, three types of waves are generally generated such as an incident read wave W1, a reflected wave W2, and an incident terminating wave W3.

The incident read wave W1 proceeds from one of the RDRAMs 42 to 44 to the memory controller 41. The reflected wave W2 is generated due to the reflection of the incident wave W1 from the memory controller 41. The incident terminating wave W3 proceeds from the RDRAMs to the terminal resistor Rterm. The three waves W1 to W3 have a level of Vsw/2 (here, Vsw is the voltage swing shown in FIG. 4).

Figure 6:
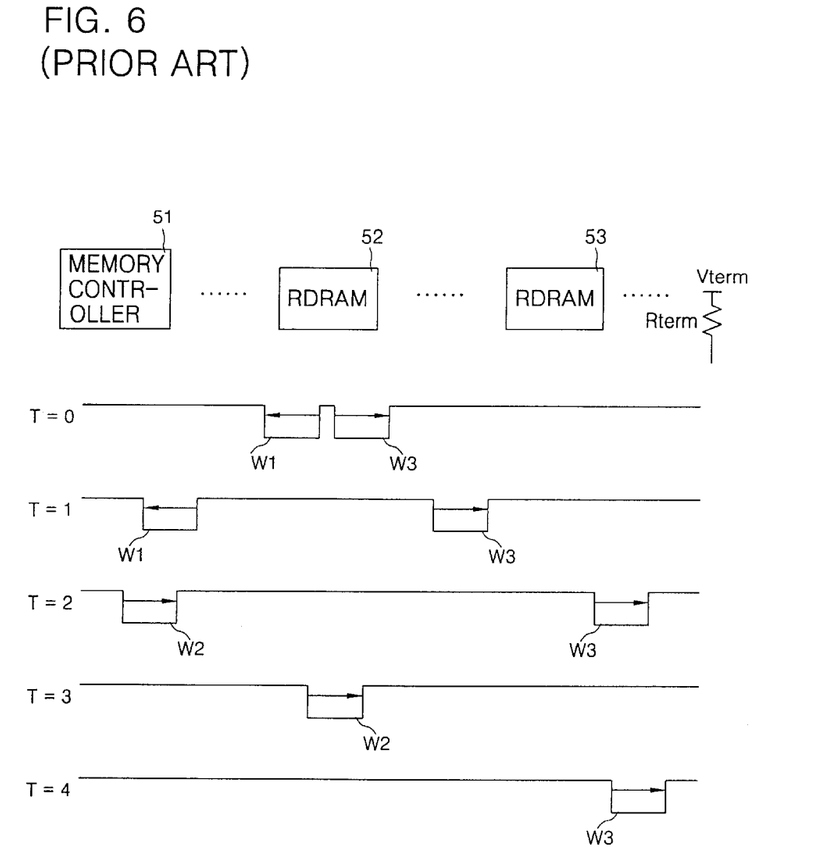
FIG. 6 is a waveform diagram illustrating states of the waves in FIG. 5 when data are normally read from RDRAMs.

FIG. 6 is a waveform diagram illustrating the different states of the three waves W1 to W3 of FIG. 5 when data are normally read from the RDRAMs. In FIG. 6, "T=0" to "T=4" each denotes a lapse of time. As shown in FIG. 6, data can be read normally when there is no back-to-back noise due to a previous read operation. However, when noise (e.g., back-to-back noise) due to a previous read operation occurs, the noise affects the next data read operation as shown in FIG. 7.

Figure 7:
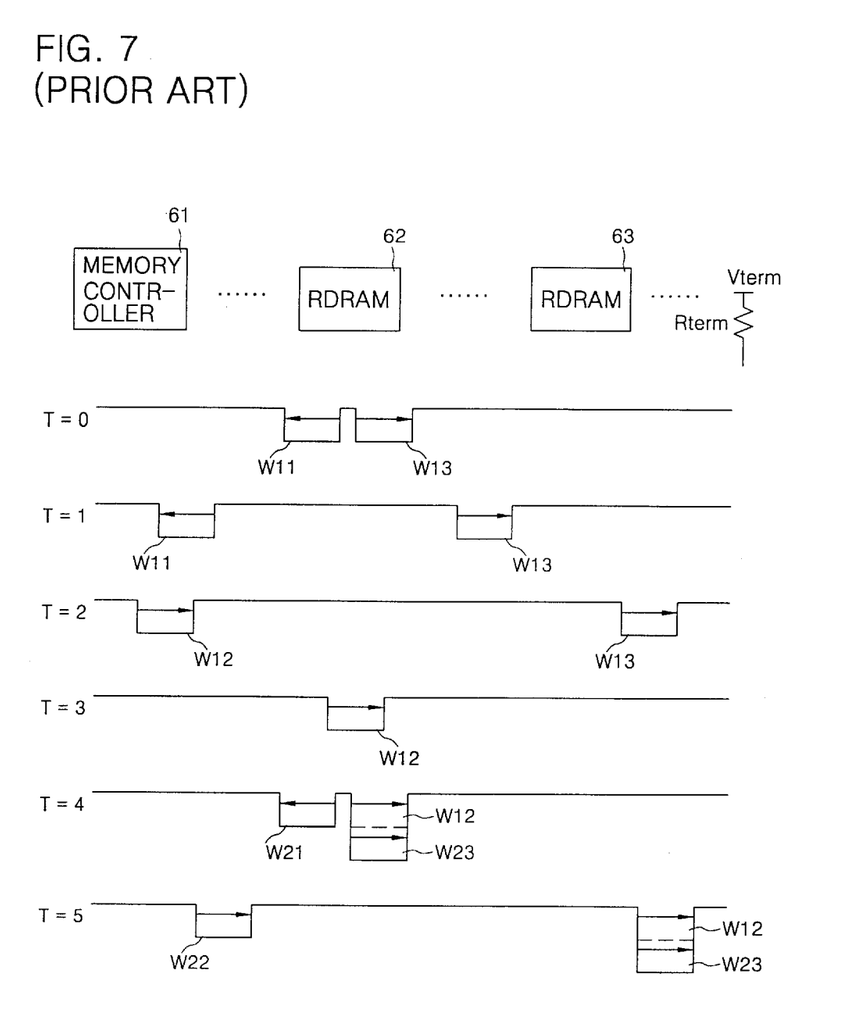
FIG. 7 is a waveform diagram illustrating states of the waves in FIG. 5 when data are abnormally read from RDRAMs due to a back-to-back noise.

FIG. 7 is a waveform diagram illustrating the waves affected by the back-to-back noise. In FIG. 7, references W11 to W13 denote the three types of waves generated when data are read from a RDRAM during a first read cycle, and references W21 to W23 denote the three types of waves generated when data is read from the RDRAM during a second read cycle. As shown in FIG. 7, the reflected wave W12 generated during the first read cycle and the incident terminating wave W23 generated during the second read cycle are overlapped at time T4, so that the RDRAM is driven at a relatively low voltage when data is read from the RDRAM 62. Therefore, a problem exists that data is erroneously read from the RDRAM 62, leading to an abnormal operation.

That is, since the same reference voltage is applied to all of the memory modules, the RSL output level of data outputted from the RDRAM varies. As a result, the relation of Vol−Vref=Vref−Vol (referring to FIG. 4) cannot be maintained and data cannot be read normally. Thus, abnormal operations occur due to the back-to-back noise in the conventional Rambus memory system.

In efforts to overcome the problem described above, there has been proposed a Rambus memory system employing an "over driving factor" (ODF) technique in which a driving capability of the system during a data read operation is controlled according to conditions of memory modules of the system. However, the Rambus memory system employing the ODF technique also has problems such as degradation of other driving parameters (e.g., tQmax/Qmin) and a decrease in manufacturing yield.

Therefore, a need exists for a Rambus memory system in which no abnormal read operation occurs due to the back-to-back noise.

SUMMARY OF THE INVENTION

Preferred embodiments of the present invention are provided to describe a semiconductor memory device which overcomes the above and other problems in the conventional memory system and has high reliability and manufacturing yield.

In an aspect of the present invention, a memory system includes a plurality of slots for receiving the plurality of memory modules, each memory module having semiconductor memories, wherein each of the plurality of memory modules is applied a different level of reference voltage.

According to another aspect of the present invention, a memory system includes a plurality of memory slots; a plurality of memory modules each having semiconductor memory devices and being mounted on corresponding ones of the memory slots; and a reference voltage source for providing different reference voltages to the memory modules, wherein each reference voltage is provided to memory devices of a corresponding memory module.

In another aspect of the present invention, a memory system includes a plurality of memory slots; a plurality of memory modules each having semiconductor memory devices and being mounted on corresponding one of the memory slots; a reference voltage source for generating an external reference voltage; and a plurality of voltage regulators each being associated with corresponding one of the memory modules, each of the voltage regulators receiving the external reference voltage and regulating the external reference voltage in response to a control signal to provide a reference voltage to corresponding one of the memory modules, wherein the reference voltages having different voltage levels are provided to the respective memory modules.

The memory system according to the preferred embodiments of the present invention has the following advantage. Since the reference voltages with different levels are applied to the memory modules, the system is not affected by a noise generated by the previously read data can be reduced and data can be read normally. Thus, high reliability and manufacturing yield can be accomplished.

BRIEF DESCRIPTION OF THE DRAWINGS

For a more complete understanding of the present invention and the advantages thereof, reference is now made to the following descriptions taken in conjunction with the accompanying drawings, in which like reference numerals denote like parts, and in which.

DETAILED DESCRIPTION OF PREFERRED EMBODIMENTS

Reference will now be made in detail to preferred embodiments of the present invention, examples of which are illustrated in the accompanying drawings.

Figure 8A:
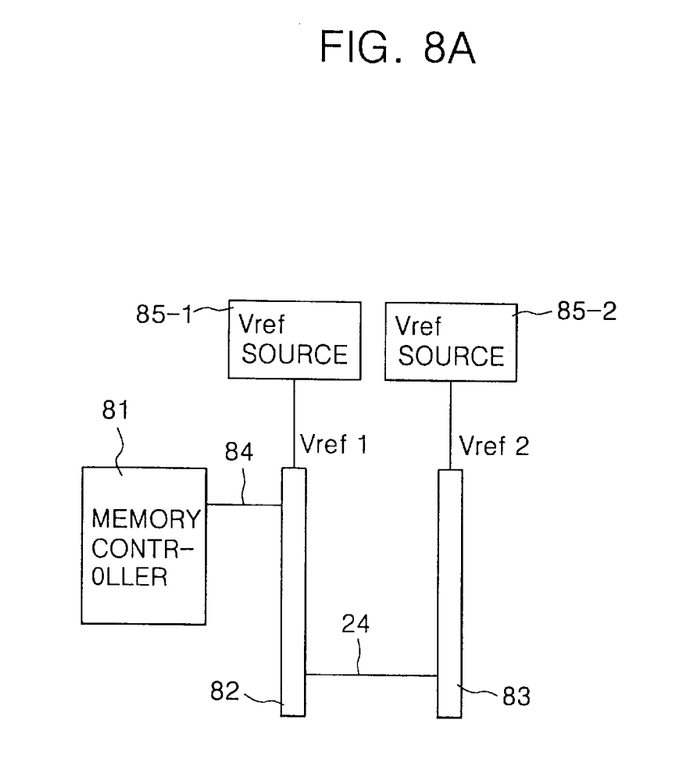
FIGS. 8A and 8B are block diagrams illustrating memory modules and a reference voltage source of a memory system according to a first preferred embodiment of the present invention.
Figure 8B:
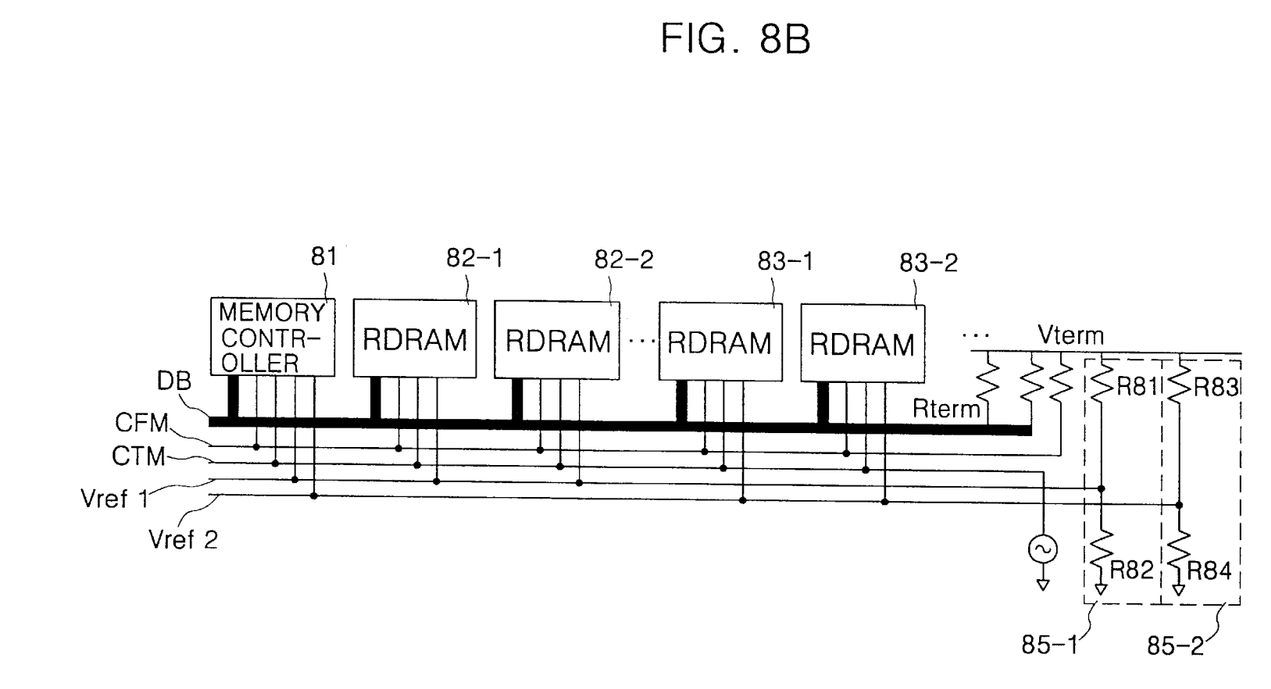

FIGS. 8A and 8B show a memory system according to a first preferred embodiment of the present invention. The memory system includes a plurality of reference voltage sources. The reference voltage sources provide reference voltages different from each other to the respective memory modules. The memory system of the present invention is applicable to, but not limited to, a Rambus memory system.

In FIGS. 8A and 8B, there is provided a Rambus memory system according to the present invention. A memory controller 81 is connected to RDRAMs 82-1 and 82-2 of a first memory module 82 and RDRAMs 83-1 and 83-2 of a second memory module 83 through a Rambus channel 84. The first and second memory modules 82, 83 may be mounted on two memory slots (e.g., RIMM connectors), respectively. The Rambus channel 84 is a transmission line providing an electrical connection between a terminal resistor Rterm and the memory controller 81.

In FIG. 8B, reference DB denotes a data bus to transmit I/O data of a predetermined size, e.g., 9-bit, reference CFM (clock from master) is a clock signal transmitted from the memory controller 81, and reference CTM (clock to master) is a clock signal to be inputted to the memory controller 81.

Further, the Rambus memory system includes first and second reference voltage sources 85-1 and 85-2 associated with the first and second memory modules 82 and 83, respectively. The first and second reference voltage sources 85-1 and 85-2 provide the first and second memory modules 82 and 83 with first and second reference voltages Vref1 and Vref2, respectively, of which levels are different from each other.

Referring to FIG. 8B, the first reference voltage source 85-1 includes resistors R81 and R82 that are connected in series between the terminal voltage Vterm and a ground voltage. The first reference voltage source 85-1 provides the first memory module 82 with the first reference voltage Vref1 which is determined by a voltage division using the serial resistors R81 and R82. Thus, the first reference voltage Vref1 is applied to the RDRAMs 82-1 and 82-2 of the first memory module 82.

The second reference voltage source 85-2 includes resistors R83 and R84 that are connected in series between the terminal voltage Vterm and the ground voltage. The second reference voltage source 85-2 provides the second memory module 83 with the second reference voltage Vref2 which is determined by a voltage division using the serial resistors R83 and R84. Thus, the second reference voltage Vref2 is applied to the RDRAMs 83-1 and 83-2 of the second memory module 83.

As described above, the memory system of the present invention provides the reference voltages each having a different level to the respective memory modules by employing the multiple reference voltage sources. For example, the first reference voltage Vref1 of 1.40 volts can be applied to the first memory module 82 by controlling resistance values of the serial resistors R81 and R82, and the second reference voltage Vref2 of 1.35 volts can be applied to the second memory module 83 by controlling resistance values of the serial resistors R83 and R84. In this case, the RDRAMs 82-1 and 82-2 of the first memory module 82 maintain a data swing of 800 mV that is normal, and the RDRAMs 83-1 and 83-2 of the second memory module 83 have a data swing of 850 mV that is relatively large.

As described above, the occurrence of noise (e.g., back-to-back noise) due to data read from the RDRAMs 82-1 and 82-2 of the first memory module 82 can be prevented by providing each of the memory modules with different driving capabilities. Thus, abnormal operations due to noise during a data read operation can be prevented.

The configuration of the first and second reference voltage sources 85-1 and 85-2 of FIG. 8B is exemplary. It is also possible that the first and second reference voltage sources 85-1 and 85-2 are implemented within the first and second memory modules, respectively, to generate the first and second reference voltages each having a different level.

Figure 9:
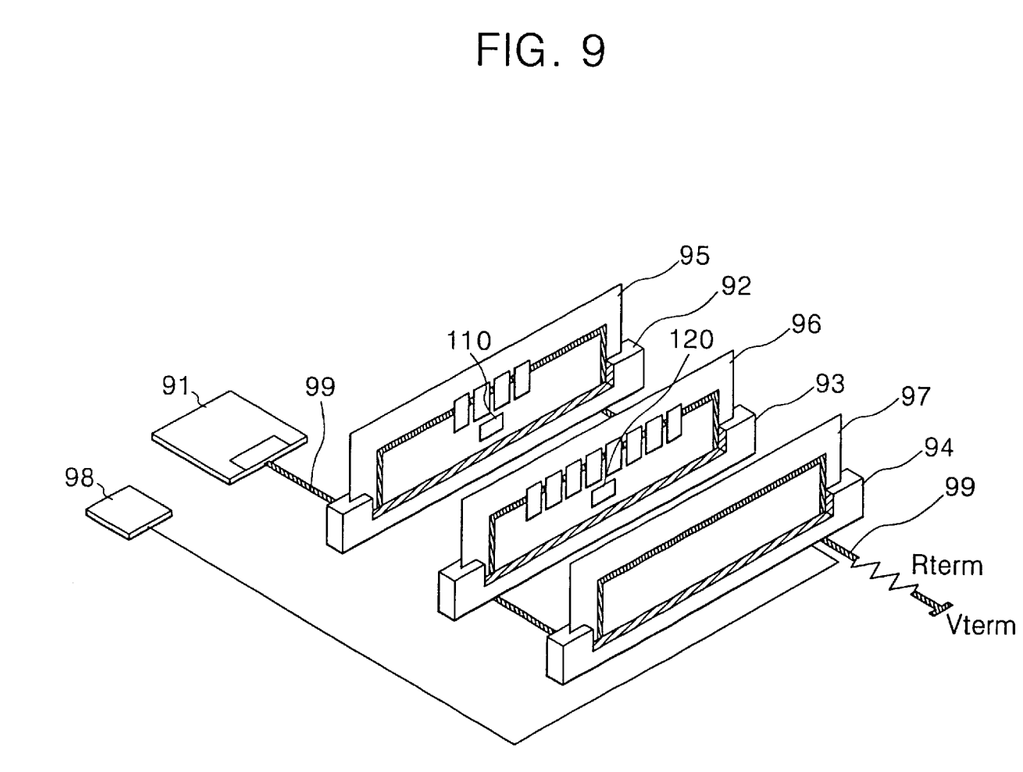
FIG. 9 is a schematic view illustrating a memory system according to a second preferred embodiment of the present invention.

FIG. 9 is a schematic view illustrating a memory system according to a second preferred embodiment of the present invention. The memory system according to the second preferred embodiment of the present invention includes memory modules each having a voltage regulator to provide a reference voltage, so that the memory modules are provided with the respective reference voltages each having a different level. The memory system according to the second embodiment of the present invention is also applicable to, but not limited to, a Rambus memory system.

In FIG. 9, a Rambus memory system is provided in accordance with the second embodiment of the present invention. The Rambus memory system in FIG. 9 includes a master element 91 having a Rambus ASIC cell (RAC) and a Rambus memory controller, Rambus in-line module (RIMM) connectors or memory slots 92 to 94, RIMM memory modules 95 and 96 mounted on the RIMM connectors 92 and 93, a RIMM continuity module 97, and a direct Rambus clock generator (DRCG) 98.

Each of the RIMM memory modules 95 and 96 includes a plurality of Rambus DRAMs (RDRAMs). A Rambus channel 99 provides an interface between the master element 91 and the RDRAMs of each of the RIMM memory modules 95 and 96. The Rambus channel 99 is a transmission line providing an electrical connection between the master element 91 and a terminal resistor Rterm to which a terminal voltage Vterm is applied.

Also, each of the memory modules 95 and 96 includes a voltage regulator for providing a reference voltage with a predetermined level.

Figure 10:
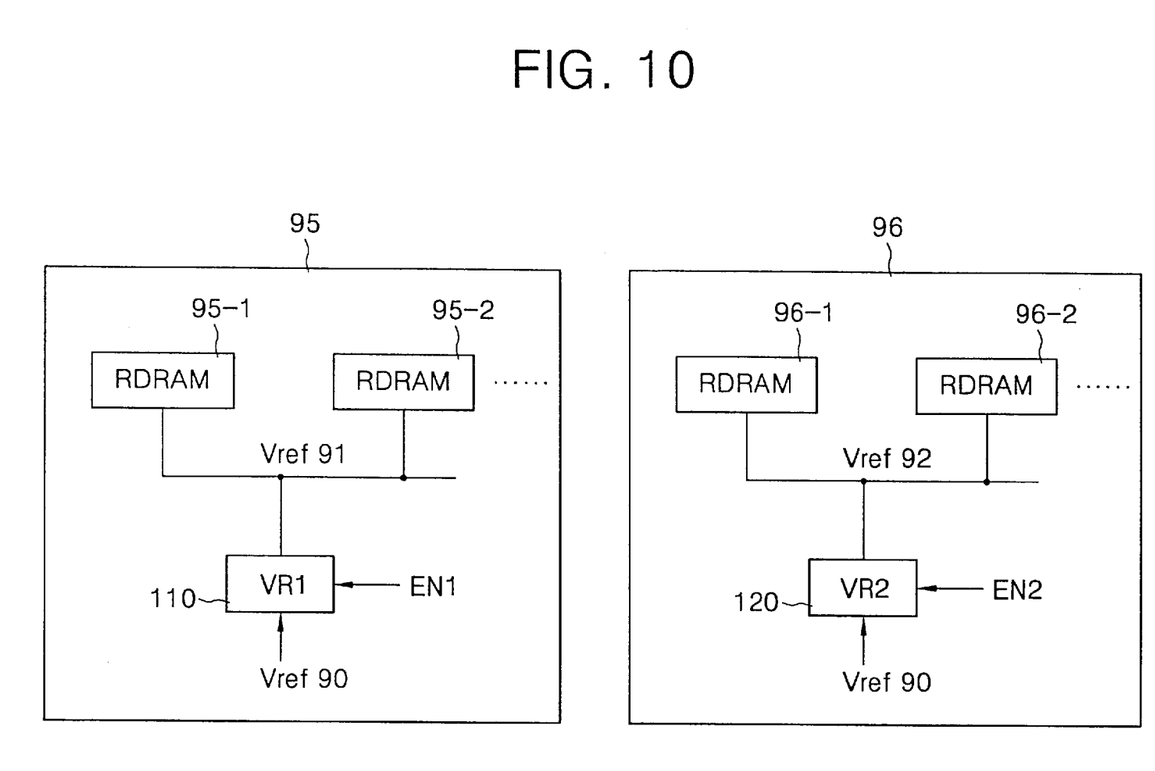
FIG. 10 is a block diagram illustrating memory modules and a reference voltage source of the memory system in FIG. 9.

FIG. 10 is a block diagram illustrating the memory modules 95, 96 in FIG. 9. As shown in FIG. 10, a first voltage regulator 110 mounted on the first memory module 95 provides a first reference voltage Vref91 of a predetermined level to the RDRAMs 95-1 and 95-2. A second voltage regulator 120 mounted on the second memory module 96 provides a second reference voltage Vref92 of a predetermined level to the RDRAMs 96-1 and 96-2.

The first and second voltage regulators 110 and 120 may be disabled in response to control signals such as enable signals EN1 and EN2 applied from the memory controller of the master element 91. In this case, a reference voltage Vref9O applied from the outside of the first and second memory modules 95 and 96 is provided to the RDRAMs of the first and second memory modules 95 and 96 by bypassing the first and second voltage regulators 110 and 120.

When the first and second voltage regulators 110 and 120 are enabled in response to the enable signals EN1 and EN2 applied from the memory controller of the master element 91, the first and second voltage regulators 110 and 120 regulate the reference voltage Vref9O applied from the outside of the memory modules 95 and 96 to provide the first and second memory modules with the first and second reference voltages Vref91 and Vref92, respectively, each of which has a level suitable for the corresponding memory module.

As described above, in the Rambus memory system of FIG. 9, the first and second reference voltages Vref91 and Vref92 each having a different level are provided to the first and second memory modules 95 and 96 through the first and second voltage regulators 110 and 120, respectively.

A more detailed description of the operation of the first and second voltage regulators 110 and 120 follows.

Assuming that the first control signal EN1 provided to the first voltage regulator 110 is an enable signal and the second control signal EN2 provided to the second voltage regulator 120 is a disable signal, the first voltage regulator 110 is enabled and the second voltage regulator 120 is disabled. In this case, the first voltage regulator 110 regulates the reference voltage Vref9O applied from outside of the first and second memory modules 95 and 96 to provide the first reference voltage Vref91 of a predetermined level to the first memory module 95, so that the first reference voltage Vref91 is applied to the RDRAMs 95-1 and 95-2. Since the second voltage regulator 120 is disabled, the reference voltage Vref9O bypasses the second voltage regulator 120 and is provided to the second memory module 96. Therefore, the reference voltage Vref9O is applied to the RDRAMs 96-1 and 96-2 of the second memory module 96 as the second reference voltage Vref92.

Assuming that the first control signal EN1 is a disable signal and the second control signal EN2 is an enable signal, the first voltage regulator 110 is disabled and the second voltage regulator 120 is enabled. In this case, the reference voltage Vref90 applied from the outside of the first and second memory modules 95 and 96 bypasses the first voltage regulator 110 and is provided to the first memory module 95, so that the reference voltage Vref90 is applied to the RDRAMs 95-1 and 95-2 of the first memory module 95 as the first reference voltage Vref91. And, the second voltage regulator 120 is enabled to regulate the reference voltage Vref90 to provide the second reference voltage Vref92 of a predetermined level to the RDRAMs 96-1 and 96-2 of the second memory module 96.

As described above, the effect of a noise that otherwise would have been caused by data of the previous read operation may be effectively reduced or eliminated by applying the reference voltages each having a different level to the respective memory modules and varying a swing of the output data. As a result, data can be read normally from the RDRAMs of the memory modules.

In the present invention, the reference voltages may be provided to the respective memory modules either from the outside of the memory chip or from voltage regulators each generating an inner reference voltage within the memory chip. A reference voltage source for generating a reference voltage can be implemented by employing multiple resistors, for example, two serial resistors as shown in FIG. 8b. It should also be noted that the number of memory modules and the number of RDRAMs mounted on each memory module in the present invention are not limited to the numbers of those in the embodiments of the above description.

The memory system according to the preferred embodiments of the present invention has the following advantage. Since the memory modules of the memory system are not affected by the back-to-back noise, data can be read normally and high reliability and manufacturing yield can be accomplished.

While the invention has been particularly shown and described with reference to the preferred embodiments thereof, it will be understood by those skilled in the art that the foregoing and other changes in form and details may be made therein without departing from the spirit and scope of the invention.

What is claimed is:

1. A semiconductor memory device for housing a plurality of memory modules, comprising:
   a plurality of slots for receiving the plurality of memory modules, each memory module having semiconductor memories, wherein each of the plurality of memory modules is applied a different level of reference voltage;
   a plurality of reference voltage sources for providing different reference voltages to respective memory modules; and
   a channel for providing electrical connection between the reference voltage sources and the memory modules, wherein the reference voltage sources are disposed outside the memory modules.

2. The semiconductor memory device of claim 1, wherein each of the reference voltage sources includes at least two resistors for determining a value of a reference voltage generated from a corresponding reference voltage source.

3. The semiconductor memory device of claim 1, wherein the reference voltage sources are configured in the memory modules, each of the reference voltage sources being associated with a corresponding memory module.

4. The semiconductor memory device of claim 3, further including an external reference voltage source for providing an external reference voltage to the reference voltage sources.

5. The semiconductor memory device of claim 4, wherein each of the reference voltage sources includes a voltage regulator for regulating the external reference voltage to provide a reference voltage to a corresponding memory module.

6. The semiconductor memory device of claim 4, wherein the external reference voltage source includes at least two resistors connected in series between a terminal voltage and a ground voltage.

7. A semiconductor memory device for housing a plurality of memory modules, comprising:
   a plurality of slots for receiving the plurality of memory modules, each memory module having semiconductor memories, wherein each of the plurality of memory modules is applied a different level of reference voltage;
   a plurality of reference voltage sources for providing different reference voltages to respective memory modules, wherein the reference voltage sources are configured in the memory modules, each of the reference voltage sources being associated with a corresponding memory module; and
   an external reference voltage source for providing an external reference voltage to the reference voltage sources, wherein each of the reference voltage sources includes a voltage regulator for regulating the external reference voltage to provide a reference voltage to a corresponding memory module,
   wherein the external reference voltage bypasses the voltage regulator when the voltage regulator is disabled in response to a control signal, and the external reference voltage is regulated by the voltage regulator when the voltage regulator is enabled in response to the control signal.

8. A semiconductor memory device for housing a plurality of memory modules comprising:
   a plurality of slots for receiving the plurality of memory modules, each memory module having semiconductor memories, wherein each of the plurality of memory modules is applied a different level of reference voltage; and
   a plurality of voltage regulators each of which is disposed in corresponding one of the plurality of memory modules and an external reference voltage source disposed outside the memory modules, wherein each of the voltage regulators receives an external reference voltage from the external reference voltage source and regulates the external reference voltage in response to a control signal to provide a reference voltage to a corresponding memory module.

9. The semiconductor memory device of claim 8, wherein a voltage regulator disposed in a coresponding memory module is enabled or disabled in response to the control signal, wherein the external reference voltage is provided to memory devices of the corresponding memory module when the voltage regulator is disabled, and the external reference voltage is regulated by the voltage regulator to provide the reference voltage to the memory devices of the corresponding memory module when the voltage regulator is enabled.

10. The semiconductor memory device of claim 9, wherein the external reference voltage source includes at least two resistors for determining a value of the external reference voltage.

11. A memory system having a plurality of semiconductor memory devices for storing data, comprising:
   a plurality of memory slots;
   a plurality of memory modules each having semiconductor memory devices and being mounted on corresponding one of the memory slots;
   a reference voltage source for generating an external reference voltage; and
   a plurality of voltage regulators each being associated with corresponding one of the memory modules, each of the voltage regulators receiving the external reference voltage and regulating the external reference voltage in response to a control signal to provide a reference voltage to corresponding one of the memory modules,
   wherein the reference voltages having different voltage levels are provided to the respective memory modules.

12. The memory system of claim 11, wherein a voltage regulator disposed in a corresponding memory module is enabled or disabled in response to the control signal, wherein the external reference voltage is provided to memory devices of the corresponding memory module when the voltage regulator is disabled, and the external reference voltage is regulated by the voltage regulator to provide the reference voltage to the memory devices of the corresponding memory module when the voltage regulator is enabled.

13. The memory system of claim 12, wherein the reference voltage source includes resistors for determining a value of the external reference voltage.

* * * * *